(12) United States Patent
Ono

(10) Patent No.: US 6,826,712 B2
(45) Date of Patent: *Nov. 30, 2004

(54) MEMORY DEVICE HAVING REDUNDANT CELLS

(75) Inventor: Chikai Ono, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 502 days.

This patent is subject to a terminal disclaimer.

(21) Appl. No.: 09/783,554

(22) Filed: Feb. 15, 2001

(65) Prior Publication Data

US 2001/0054165 A1 Dec. 20, 2001

(30) Foreign Application Priority Data

Jun. 16, 2000 (JP) .......................................... 2000-181891

(51) Int. Cl.[7] .......................... G06F 11/00; G11C 11/50; G11C 29/00
(52) U.S. Cl. ................... 714/6; 714/7; 714/8; 365/165; 365/200
(58) Field of Search .............................. 714/6, 7, 8, 42, 714/54; 365/200, 145, 165

(56) References Cited

U.S. PATENT DOCUMENTS

| | | | | |
|---|---|---|---|---|
| 4,768,193 A | * | 8/1988 | Takemae | 714/711 |
| 4,862,416 A | * | 8/1989 | Takeuchi | 714/710 |
| 5,729,551 A | * | 3/1998 | Park et al. | 714/711 |
| 6,205,515 B1 | * | 3/2001 | Huang | 711/104 |
| 6,208,569 B1 | * | 3/2001 | Patel et al. | 365/200 |
| 6,246,616 B1 | * | 6/2001 | Nagai et al. | 365/200 |
| 6,252,809 B1 | * | 6/2001 | Kim | 365/200 |
| 6,317,355 B1 | * | 11/2001 | Kang | 365/145 |
| 6,330,198 B1 | * | 12/2001 | Koshikawa | 365/200 |
| 6,553,510 B1 | * | 4/2003 | Pekny | 714/6 |

* cited by examiner

Primary Examiner—Robert Beausoliel
Assistant Examiner—Emerson Puente
(74) Attorney, Agent, or Firm—Arent Fox, PLLC.

(57) ABSTRACT

According to an aspect of the present invention, a redundant file memory for recording first replacement information having an address of a defective cell to be replaced with a redundant cell is configured by a memory cell having the same configuration as an ordinary memory cell, and when accessing the ordinary memory cell, the redundant file memory can be accessed at the same time. Furthermore, second replacement information indicating whether or not the ordinary cell in correspondence with the stored address is a defective one is recorded in the redundant file memory. When accessing the ordinary memory cell, the first and second replacement information recorded in the redundant file memory are read out at the same time, and the defective cell is replaced with the redundant cell according to the replacement information.

8 Claims, 10 Drawing Sheets

MEMORY DEVICE HAVING REDUNDANT CELLS

BACKGROUND OF THE INVENTION

1. Field of the Invention

The present invention relates generally to a memory device having a redundant cell, and more particularly, to a memory device having a redundant file of the same configuration as that of an ordinary cell, the redundant file storing therein replacement information with a redundant cell, the memory device capable of replacing a defective cell with the redundant cell even in the wafer process stage or even after the packaging.

2. Description of the Related Arts

With its increasing capacity, a semiconductor based memory device tends to have a redundant cell for repairing a defective cell. A DRAM for use as a computer cache memory has a redundant cell and stores, in a fuse ROM (redundant ROM), address information on the defective cell replaced with the redundant cell. The supplied address is then compared with the redundant ROM stored address, and if coincident, access to the ordinary cell is prohibited with the permission of access to the redundant cell.

On the other hand, a ferroelectric memory is one of memory devices utilizing a semiconductor and exploits a residual polarization action of a ferroelectric material (hereinafter called merely FeRAM). The ferroelectric memory is paid attention to as a nonvolatile memory which can write at a high speed like a DRAM. In the same manner as in a memory cell of the DRAM, the memory cell of a FeRAM also has a simple configuration composed of a selection transistor and a capacitor, and has possibilities of increasing capacitance. A dielectric of the capacitor uses the ferroelectric material as described above, and when an electric field in a fixed direction is applied to between electrodes of the capacitor, the ferroelectric is polarized, and even after the electric field disappears, the residual polarization is left behind, so that data can be stored. Accordingly, the FeRAM is a nonvolatile memory which can hold stored data even when turned off. Moreover, the FeRAM is shorter in a time to be required for writing or erasing than an EEPROM or a flush memory spreading presently, and is expected as the nonvolatile memory of large capacitance to be replaced with the DRAM.

The FeRAM has just started developing, and a device of so large capacity has not been developed at present. Accordingly, a redundant cell and a replacement configuration to the redundant cell are not proposed. However, as the capacity increases in the future, it is apparent that the redundant cell configuration is necessary even in the FeRAM, and it is necessary to propose the redundant cell and the replacement configuration therefor.

The FeRAM differs from the DRAM as follows: First, as a manufacturing process is yet at an initial stage, it is necessary to form a redundant cell configuration as a circuit configuration as simple as possible. Secondly, in the FeRAM, the defective cell is detected by a wafer test, and also after an acceleration test to be carried out after a memory chip is accommodated in a package, a frequency that the defective cell is detected is not few, and it is necessary to replace the defective cell with the redundant cell even after accommodated in the package.

Accordingly, in using the fuse ROM to be cut off by a laser adopted in the DRAM as the redundancy ROM, it is necessary that a memory of a configuration different from the memory cell is formed in a chip as the redundancy ROM. Furthermore, the defective cell can be repaired only at a wafer stage, and the defective cell cannot be repaired after at accommodated in the package.

Furthermore, even in the DRAM, as long as the redundancy ROM is constituted by the present fuse ROM, first, the defective cell detected after accommodated in the package cannot be repaired. Furthermore, in the normal DRAM, it is generic that a column containing the defective cell is replaced with a redundancy column. In such a replacement method, in the case where the defective cell dispersedly generates within the chip, since the number of replaceable redundancy columns has a limit, it may become impossible to repair. Accordingly, repair probability has naturally a limit.

SUMMARY OF THE INVENTION

It is therefore an object of the present invention to provide a memory device in which a redundant cell and a redundant file memory for recording replacement information for the redundant cell is configured by a simple manner.

Furthermore, it is an object of the present invention to provide a memory device which can replace a defective cell with a redundant cell even after a memory chip is accommodated in a package.

Furthermore, it is an object of the present invention to provide a FeRAM in which a redundant file memory for recording replacement information to a redundant cell is realized by a simple configuration.

Furthermore, it is an object of the present invention to provide a FeRAM in which, even after a memory chip is accommodated in a package, a defective cell can be replaced with a redundant cell.

In order to attain the above objects, according to a first aspect of the present invention, a redundant file memory for recording first replacement information having an address of a defective cell to be replaced with a redundant cell is configured by a memory cell having the same configuration as an ordinary memory cell, and when accessing the ordinary memory cell, the redundant file memory can be accessed at the same time. Furthermore, second replacement information indicating whether or not the ordinary cell in correspondence with the stored address is a defective one is recorded in the redundant file memory. When accessing the ordinary memory cell, the first and second replacement information recorded in the redundant file memory are read out at the same time, and the defective cell is replaced with the redundant cell according to the replacement information.

With such configuration, the configuration of the redundant file memory can be same with the ordinary memory cell and the redundant cell, thereby simplifying the redundancy circuit configuration. Furthermore, as the redundant file memory can be written in the same manner as in the ordinary memory cell, even after the memory chip is accommodated in the package, it is possible to replace the defective cell with the redundant cell and to record the replacement information. That is, even after the memory chip is accommodated in the package, the defective cell can be repaired. Furthermore, as the replacement information whether or not the cell is a defective one is recorded in the redundant file memory, the replacement information can be changed for each word line. Accordingly, with such the configuration, it is possible to replace the defective cell with the redundant cell in a cell unit. Accordingly, in the case of such the configuration, it is possible to increase the repair probability of the defective cell more than the case of replacing with the redundant cell in column unit and word unit.

Furthermore, with the above configuration, only the first replacement information indicating the address of the defective cell is recorded in the redundant file memory. Accordingly, the first replacement information can be configured in n bit for the ordinary memory area having $2^n$ replacement units, and an information amount of the defective cell to be replaced can be lessened. The second replacement information indicating whether or not the ordinary cell corresponding to the address is a defective cell is also recorded in the redundant file memory in addition to the first replacement information.

In order to attain the above object, according to a second aspect of the present invention, in a memory circuit having a plurality of blocks each of which includes an ordinary cell region having the ordinary cell and a redundant cell region, the redundant file memories are in common provided in the plurality of blocks. The first replacement information and the second replacement information are recorded in the redundant file memory. The first replacement information has the address of the defective cell in the block and a block address corresponding to the defective cell, and the second replacement information indicates whether or not the cell corresponding to the first replacement information is the defective cell.

According to the more preferred embodiment, in the second aspect, the memory cell includes a transistor connected to a word line and a capacitor connected to the transistor and having a ferroelectric film, and the word lines are in common provided for the plurality of blocks, and source lines connected to the capacitors are provided in each block. The source line of the selected block is driven, and also the source line of the redundant file memory is driven along with the word lines.

DESCRIPTION OF THE PREFERRED EMBODIMENTS

Presently preferred embodiments of the present invention will now be described with reference to the accompanying drawings. However, such embodiments do not limit the technical scope of the present invention.

The present invention is not limited to a FeRAM utilizing a ferroelectric film but is applicable to the other types of memory device. The following embodiments will be explained with respect to FeRAM by way of example. Furthermore, the present invention is useful, in particular, in the case where the present invention is applied to the FeRAM utilizing the ferroelectric film, as shown below.

Figure 1:
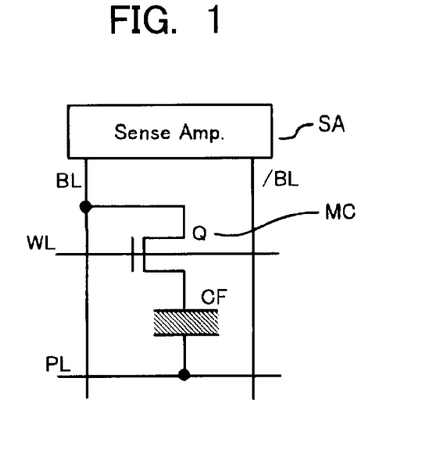
FIG. 1 is a diagram showing a memory cell configuration of a FeRAM according to this embodiment.

FIG. 1 is a diagram showing a memory cell configuration of the FeRAM according to this embodiment. A memory MC of the FeRAM is configured by a selecting transistor Q connected to a word line WL and a bit line BL, and a storing capacitor CF having the ferroelectric film. One electrode of the capacitor CF is connected to the transistor Q, and the other electrode is connected to a plate line PL. The bit line BL connected to the transistor Q is connected to a sense amplifier SA together with a bit line/BL on the opposite side.

Figure 2:
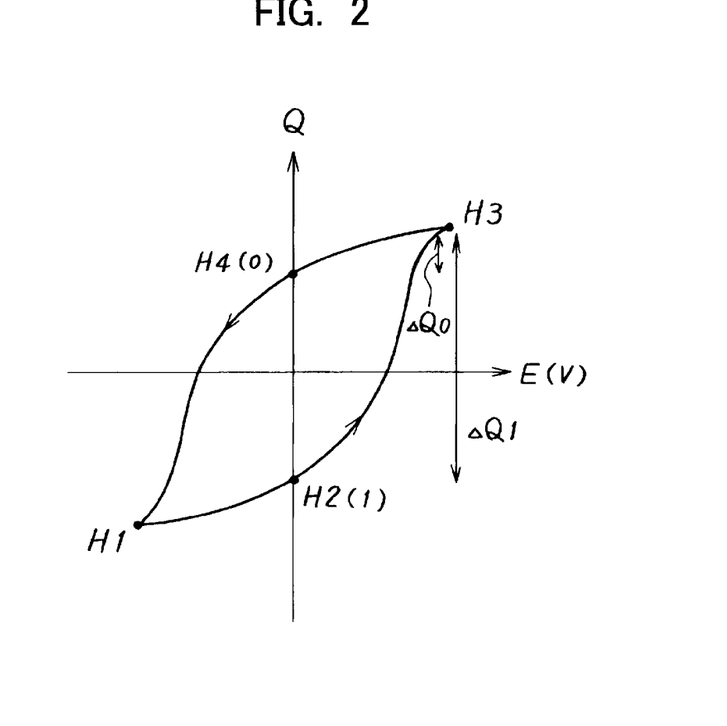
FIG. 2 is a hysteresis characteristic diagram of a ferroelectric film.

FIG. 2 is a hysteresis characteristic diagram of the ferroelectric film. A transversal axis denotes an electric field (a voltage) to be applied to the ferroelectric film, and a vertical axis denotes an electric charge Q due to a polarization action. As shown in FIG. 2, when a plus electric field is applied on the ferroelectric film from a state of a point H2, a direction of polarization changes along a direction of arrow, resulting in a state of a point H3, and when the electric field is thereafter deenergized, a residual polarization is maintained in a state of a point H4. Furthermore, when a minus electric field is applied on the ferroelectric film from a state of the point H4, a direction of polarization changes along a direction of arrow, resulting in a state of the point H1, and when the electric field is thereafter deenergized, a residual polarization is maintained in a state of the point H2. Accordingly, the state of the point H2 is set as a state of data "1," and the state of the point H4 is set as a state of data "0," thereby recording binary data.

By utilizing the above principle, in writing into a memory cell MC of FIG. 1, the bit line BL is set as an H level, and the plate line PL is set as an L level, and the word line WL is set as an H level so that the transistor Q is conductive, the electric field in a first direction is applied on the ferroelectric film of the capacitor CF, resulting in, for example, the state of the point H1. Thereafter, the word line WL is set as the L level, and the transistor Q is made nonconductive, and even when the electric field of the ferroelectric film of the capacitor CF is deenergized, the ferroelectric film maintains a polarization state of storing the data "1" of the state H2. Furthermore, the bit line BL is set as the L level, and the plate line PL is set as the H level, and the word line is set as the H level so that the electric field in a second direction reverse to the first direction is applied on the ferroelectric film of the capacitor, and thereafter the word line is set as the L level, the ferroelectric film maintains the polarization state of storing the data "0" of the state H4.

Figure 3:
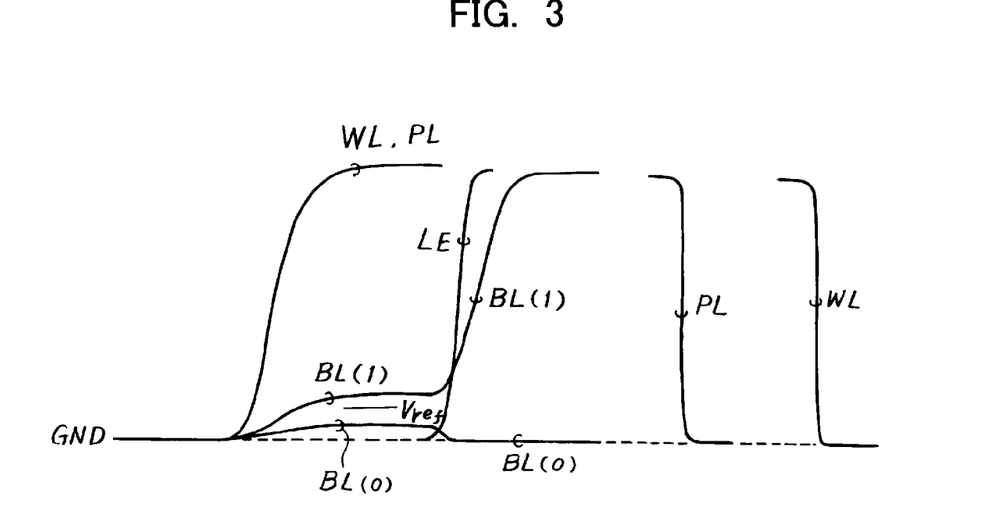
FIG. 3 is a read-out operational waveform illustration of the FeRAM.

FIG. 3 is a read-out operational waveform illustration of the FeRAM. In the read-out of the memory cell MC of FIG. 1, the bit line BL is reset as the L level (ground level), and the word line WL is set as the H level, and the plate line PL is also set as the H level. As the results of setting the plate line PL as the H level, the electric field when the data "0" is written is applied on the ferroelectric film of the capacitor CF, resulting in the state H3 of FIG. 2. As the results, in the case where the data "1" is stored, the state H2 changes to the state H3, and large electric charges ΔQ1 flow into the bit line BL. Furthermore, in the case where the data "0" is stored, the state H4 changes to the state H3, and small electric charges ΔQ0 flow into the bit line BL. Accordingly, in accordance to the stored data, a level of the bit line BL rises largely (data "1"), or rises slightly (data "0"). This changed level is detected by the sense amplifier SA by comparing it with a reference voltage Vref.

As the FeRAM performs a destructive read-out as above, after the level of the bit line BL is sufficiently amplified as the H level, or L level, the plate line PL is lowered to the L level, and the electric field in a write state in correspondence with the respective detected data is applied on the ferroelectric film. Thereafter, the word line WL is lowered, thereby returning to the state of storing the respective data, so that a re-write is ended.

Figure 4:
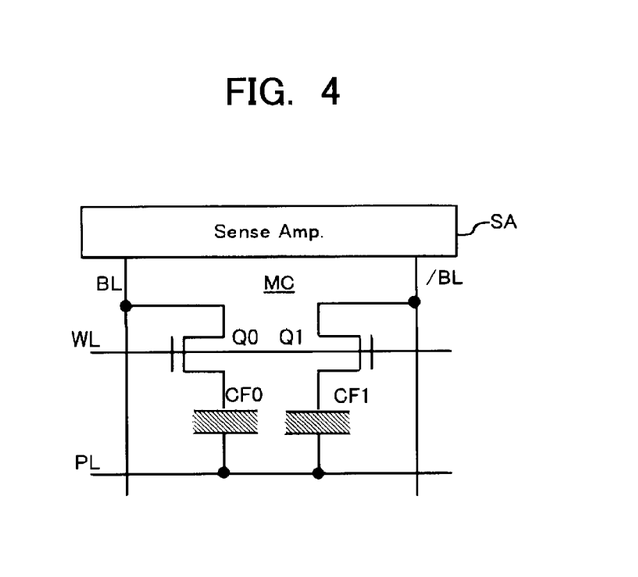
FIG. 4 is a diagram showing another configuration example of the memory cell in the FeRAM.

FIG. 4 is a diagram showing another configuration example of the memory cell in the FeRAM. The memory cell MC of this example is a 2-transistor and 2-capacitor type in which the cells of FIG. 1 are paired. In the case of this type of memory cell MC, mutually inverting data are written in a pair of capacitors CF0, CF1, whereby data detection is facilitated by exploiting a differential voltage between bit line pairs at the time of read-out operations.

Figure 5:
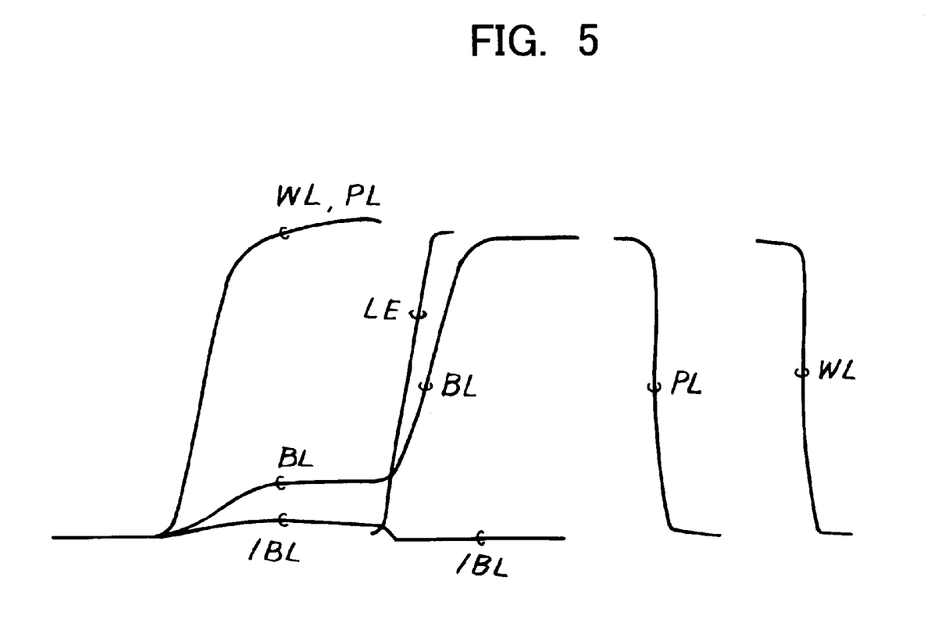
FIG. 5 is a waveform illustration showing a readout operation of the FeRAM.

FIG. 5 is a waveform illustration showing a readout operation of the memory cell of FIG. 4. After both bit lines BL, /BL are reset as the L level at the time of read-out, the word line WL rises to the H level, and the plate line PL is also driven to the H level. Thus, in the same manner as in the case of FIG. 3, the level of the bit line BL on a side of the capacitor CF0 storing the data "1" increases largely, while the level of the bit line BL on a side of the capacitor CF1 storing the data "0" increases slightly. A difference in potentials of these bit lines is detected by the sense amplifier SA and amplified. The next re-write operations are same as above.

Figure 6:
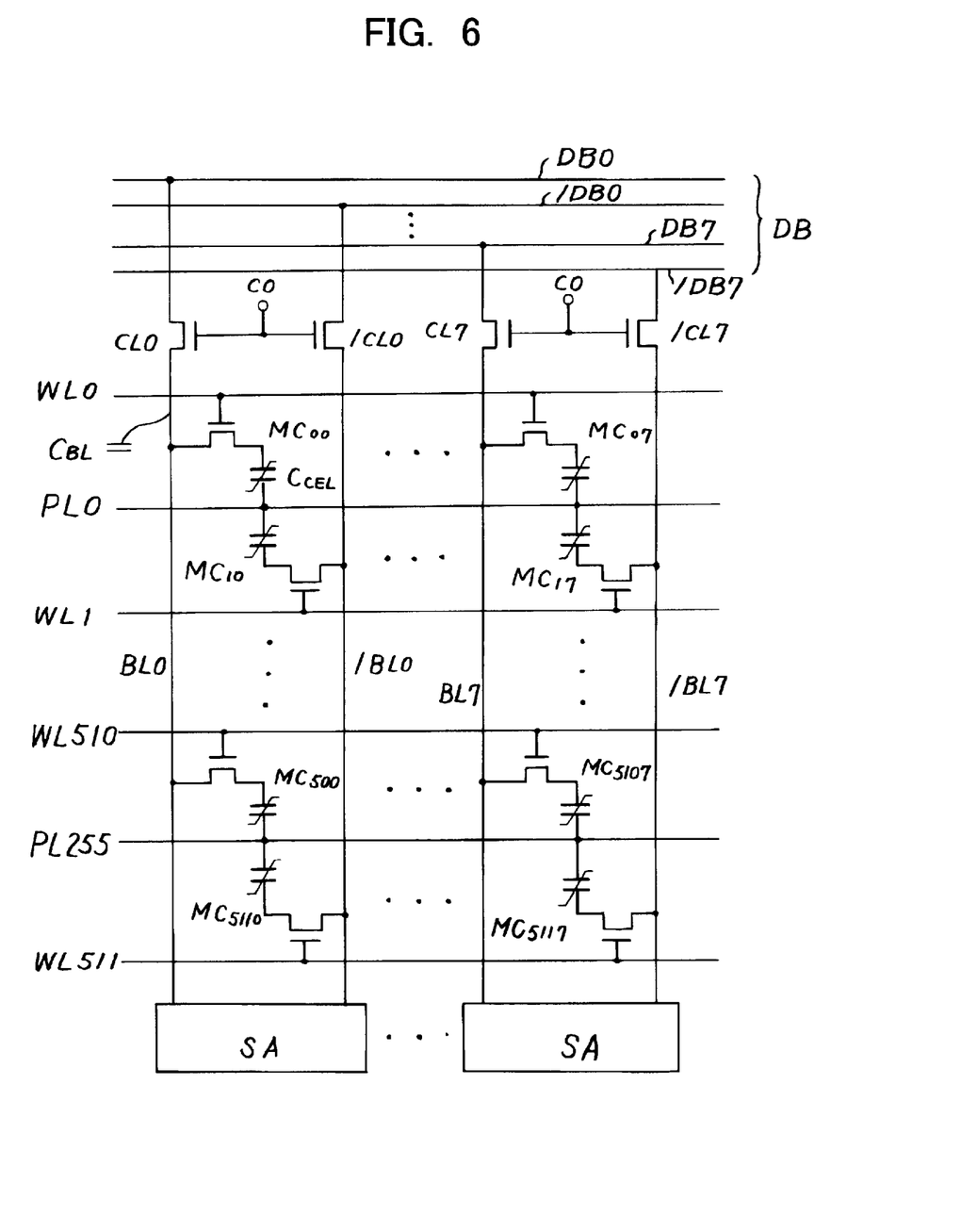
FIG. 6 is a diagram showing a configuration example of a column in a memory area of the FeRAM.

FIG. 6 is a diagram showing a configuration example of a column in the memory area of the FeRAM. The column has 8 pairs of bit lines BL0, /BL0 to BL7, /BL7, and a plurality of word lines WL0 to WL511, and the 8 pairs of bit line pairs are simultaneously connected to 8 pairs of data bus lines DB0, /DB0 to DB7, /DB7 via column gates CL0, /CL0 to CL7, /CL7 which are electrically connected concurrently according to column selection signals C0, respectively. The memory cells MC are disposed at crossing positions between the bit lines and the word lines. The plate line PL0 is shared by an even number side word line WL0 and an odd number side word line WL1. Accordingly, in the case where the even number side word line WL0 is selected, the read-out data are output to a side of the bit line BL0, and further are output to a side of the data bus line DB0. Furthermore, in the case where the odd number side word line WL0 is selected, the read-out data are output to a side of the bit line /BL0, and further are output to a side of the data bus line /DB0. Accordingly, one output of the data bus line pairs is validated in correspondence with whether the driven word line is on the odd number side or on the even number side.

As described above, with the column configuration of the FeRAM, the 8 pairs of bit lines BL are simultaneously connected to the 8 pairs of data bus lines DB. Accordingly, in the case where a defective cell exists in the column, the entire column is replaced with the column in the redundant memory area. However, it is not always necessary that the column composed of the 8 pairs of bit lines is a replacement unit to the redundant memory, and the other replacement unit may be possible.

Figure 7:
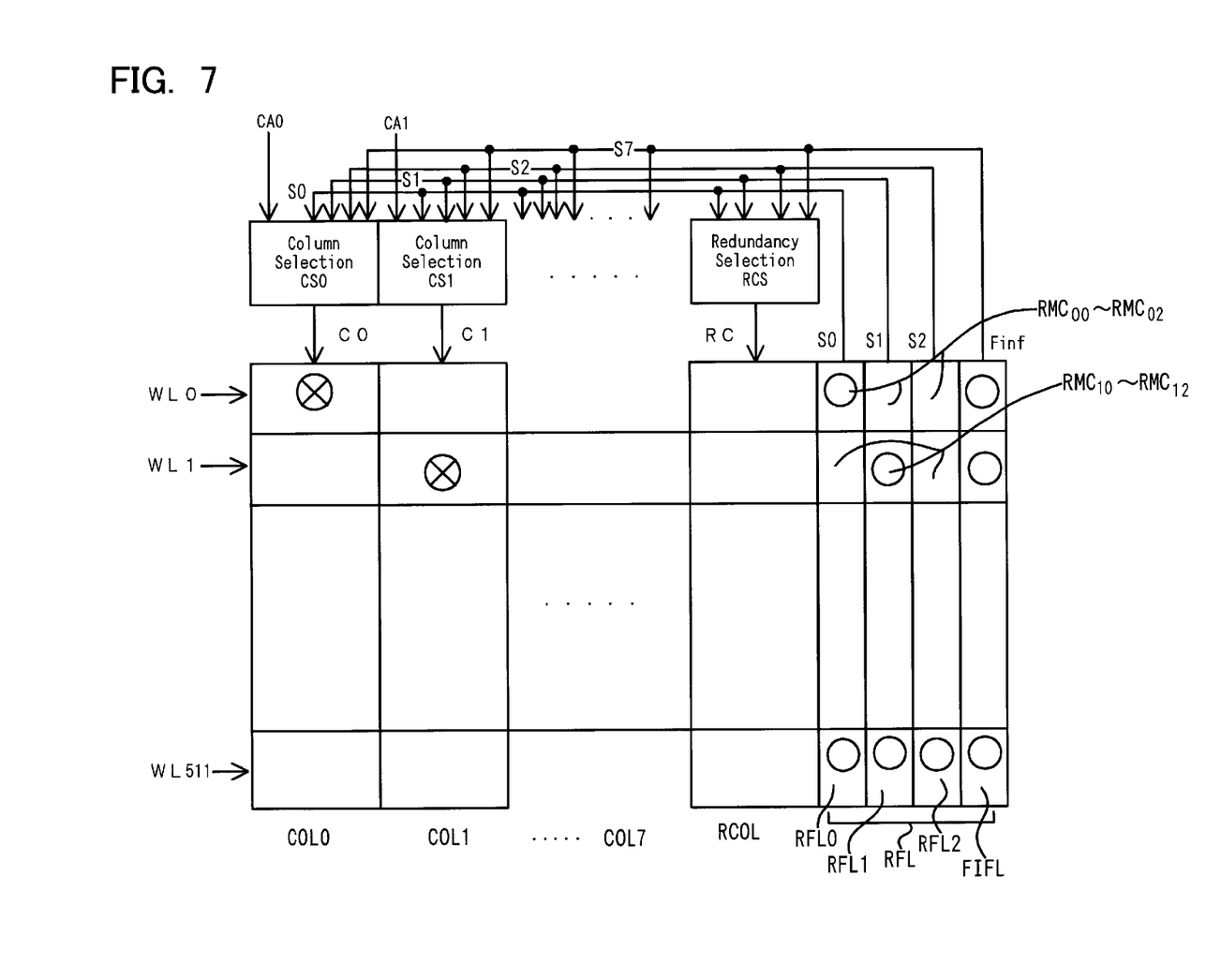
FIG. 7 is a configuration diagram of the entire memory device having a redundant cell according to the embodiment.

FIG. 7 is a configuration diagram of the entire memory device having the redundant cell according to the embodiment. In the memory device of FIG. 7, 8 columns COL0 to COL7 are provided in an ordinary memory area, and one column of the redundancy columns RCOL is separately provided in order to repair the defective cell in the ordinary memory area. Furthermore, a redundant file memory RFL records replacement information for replacing the defective cell with the redundant cell, and is configured by 3-bit first redundant file memories RFL0 to RFL2 (Feil File) for storing an address of the column having the defective cell, and a second redundant file memory FIFL (Feil Information File) for storing fail information indicating whether or not the first redundant file memory is valid.

That is, the 3-bit address of the defective cell column is recorded in the first redundant file memories RFL0 to RFL2, and information whether or not the address is valid, in other words, whether or not the column containing the defective cell exists in the corresponding word line is recorded in the second redundant file memory FIFL.

In the example of FIG. 7, the replacement information is recorded in the redundant file memory RFL along the same word line WL. Explaining the word line WL0, in the case where any one of the memory cells connected to the word lines WL0 in the column COL0 is a fail, when the word line WL0 is selected, a redundancy column RCOL in the redundant memory area is selected instead of the column COL0 in the ordinary memory area. In order to validate the replacement, replacement information indicating that the defective cell should be replaced with the redundant memory cell is recorded on the same word line in the redundant file memories RFL0 to RFL2. In other words, an address "100" of the column COL0 is recorded in the first redundant file memories RFL0 to RFL2. Along therewith, "1" indicating that information of the first redundant file memory is valid is recorded in the second redundant file memory FIFL. A round mark in FIG. 7 indicates that the data "1" is recorded.

Accordingly, when the word line WL0 is selected and driven, cells $RMC_{00}$ to $RMC_{02}$ for recording first replacement information (address) in the redundant file memory area RFL are selected, and first replacement information signals S0 to S2 indicating the replacing column addresses are output from the redundant file memories RFL0 to RFL2. At the same manner, a second replacement information signal Finf indicating that the information is valid is also output. These first replacement information signals S0 to S2 and second replacement information signal Finf are supplied to a column selection circuit CS0, so that a column selection signal C0 is set to be in a unselected state. Simultaneously, the first and second replacement information signals S0 to S2, Finf are also supplied to a redundancy selection circuit RCS, and a selection signal RC of a column RCOL in the redundant memory area is set to be in a selection state. As the results, the column COL0 having the defective cell is replaced with the redundant column RCOL in the redundant memory area.

In the case where the defective cell exists in a column COL1 in the ordinary memory area, as shown in the sample of FIG. 7, first replacement information "010" indicating the column address of the defective cell is recorded in memory cells $RMC_{10}$ to $RMC_{12}$ in the corresponding redundant file memories RFL0 to RFL2 on a same word line WL1. Second replacement information "1" indicating that the first replacement information is valid is recorded in the second redundant file memory FIFL. Accordingly, when the word line WL1 is selected and driven, the memory cells $RMC_{10}$ to $RMC_{12}$ in the first redundant file memories RFL0 to RFL2 are also selected, and the first replacement information signals S0 to S2 indicating the replacing column addresses are output from the redundant file memories RFL0 to RFL2. Simultaneously, the second replacement information signal Finf is also output. In response to these replacement information signals S0 to S2, Finf, the column selection circuit CS1 prohibits a selection of the column COL1, and the redundancy selection circuit RCS permits a selection of the redundancy column RCOL of the redundant memory area.

In the case where the defective cell exists in a column COL7 corresponding to the word line WL511, first replacement information "111" and the second replacement information "1" indicating that the first replacement information is valid are recorded in the first and second redundant file memories RFL0 to RFL2, FIFL on the same word line WL511.

Incidentally, in the case where the replacing column does not exist, second replacement information "0" is recorded in the second redundant file memory FIFL corresponding to the word line, so that the redundancy selection circuit RCS prohibits an access to the redundancy column RCOL, and the column selection circuits CS# do not prohibit an access to the ordinary column COL#.

With the redundant file memory configuration of FIG. 7, the defective cell in the column is replaceable with the redundancy column in the redundant memory area in each word line. Moreover, when the word line is selected and driven, as the first and second replacement information are read out from the corresponding redundant file memory, it is possible to prohibit the selection of the ordinary memory area and enable the selection of the redundant memory area by utilizing a signal of the replacement information. Accordingly, even when only one redundancy column is provided in the redundant memory area, it is possible to repair the defective cells generated in the plurality of columns in the ordinary memory area. However, in the case where the defective cells generate in the plurality of columns in the same word line, it is impossible to repair it in the configuration example of FIG. 7.

Furthermore, as only the address of the replacing column is recorded in the first redundant memory file, it is possible to decrease the memory capacitance. In the case where a number of column as replacement unit is $2^n$, a first redundant memory file of the redundant memory file is only n-bit, and only 1 bit of a second redundant memory file is added thereto.

Figure 8:
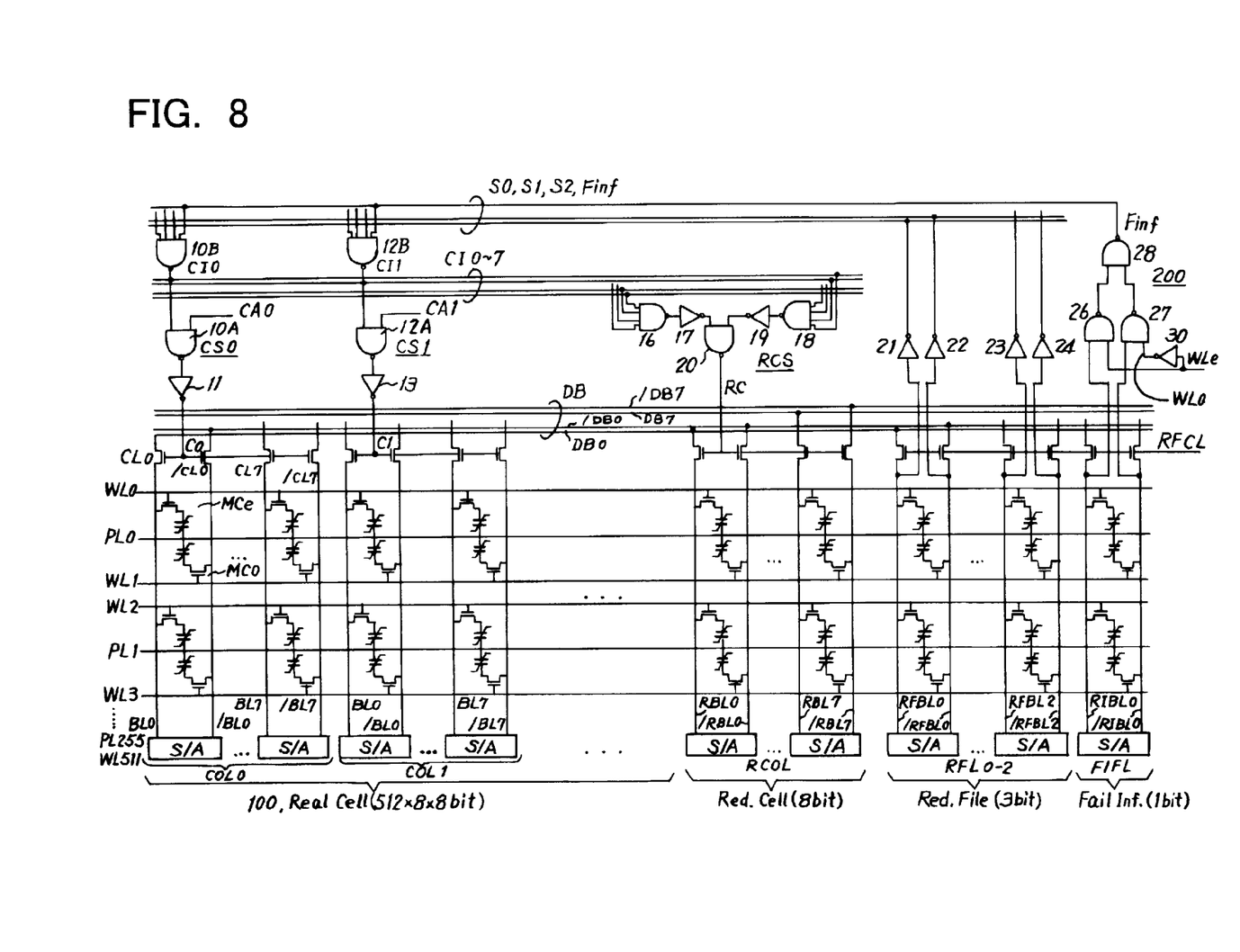
FIG. 8 is a detailed circuit diagram showing a memory device according to the embodiment.

FIG. 8 is a detailed circuit diagram showing a memory device according to the embodiment. As shown in FIG. 8, 8 columns COL0 to COL7 shown in FIG. 6 are provided in an ordinary memory area (real cell area) 100. Eight pairs of bit lines BL0, /BL0 to BL7, /BL7, 512 word lines WL0 to WL511, and 256 plate lines PL0 to PL255 are provided in each column in the same manner as in FIG. 6. The 8 pairs of bit lines are connected to 8 pairs of data bus lines DB0, /DB0 to DB7, /DB7 via column gates CL0, /CL0 to CL7, /CL7 which are conductive according to respective column selection signals C0, C1.

Furthermore, column selection circuits CS0, CS1 have NAND gates 10B, 12B for generating column replacement signals CI0, CI1 by inputting 3 combinations of 6 first replacement information signals S0 to S2 (addresses of fail columns) and the second replacement information signal Finf, and NAND gates 10A, 12A and inverters 11, 13 which set the column selection signals C0, C1 to be in a selection state, when the column replacement signals CI0, CI1 are in an unreplaced state, by inputting the above column replacement signals CI0, CI1 and column address selection signals CA0, CA1 to be supplied from a column decoder (not shown). Namely, in the case of the column selection circuit CS0, the column address selection signal CA0 is in the H level of the selection state, and when the column replacement signal CI0 is in the H level of unreplaced state, an output of the NAND gate 10A is in the L level, and the column selection signal C0 becomes in the H level by the inverter 11, and the column gate transistors CL0, /CL0 are conductive. Furthermore, even when the column address selection signal CA0 is in the H level of the selection state, if the column replacement signal CI0 is in the L level of a replacement state, an output of the NAND gate 10A becomes in the H level, and the column selection signal C0 becomes in the L level by the inverter 11, and the column gate transistors CL0, /CL0 are made nonconductive, and an output or an input (selection of the column) from the column COL is prohibited.

As shown in FIG. 8, a redundancy column RCOL of the redundant memory area has the same configuration as in the column in the ordinary memory area (real cell area) 100. Eight pairs of bit line pairs RBL0, /RBL0 to RBL7, /RBL7 of this redundancy column RCOL are connected to 8 pairs of data bus line pairs DB to /DB7 in response to a redundancy selection signal RC from a redundancy selection circuit RCS.

A redundant file memory has the same cell configuration as in the ordinary memory area 100, and has a first redundant file memory RFL0–2 comprising 3 pairs of bit lines RFBL0, /RFBL0 to RFBL2, /RFBL2, and a second redundant file memory FIFL comprising a pair of bit lines RIBL0, /RIBL0. These bit lines are connected to the data bus lines DB via transistors to be conductive in response to a redundant file memory selection signal RFCL. Thus, replacement information is written into the redundant file memory. Furthermore, these bit lines are connected to inverters 21 to 24 and a second replacement information signal generation part 200.

An even number word line and an odd number word line in a memory cell region share a plate line PL, and when selecting the even number word line, data from a memory cell are output to a left-side bit line (for example, BL0), and when selecting the odd number word line, the data from the memory cell are output to a right-side bit line (for example, /BL0). Therefore, even in the second redundant file memory FIFL, it is necessary for the selection word line to select the second replacement information to be read out in correspondence with an odd number or an even number. Accordingly, the second replacement information signal generation part 200 occasionally selects a signal from the bit lines RIBL0, /RIBL0 according to an even number word line selection signal WLe, and generates the second replacement information signal Finf. For this reason, the second replacement information signal generation part 200 has NAND gates 26, 27, 28, and an inverter 30. The NAND gates 26, 27 select a signal from the bit lines RIBL0 or /RIBL0 in correspondence with the even number word line selection signal WLe, and generates the second replacement information signal Finf from the NAND gate 28.

Now, assuming that a cell MCe in the column COL0 of the ordinary memory area is a defective cell, the column address is recorded in the memory cells of the redundant file memory RFL0–2, and data indicating that the column address is valid are recorded in the memory cell connected to a left-side bit line of the second redundant file memory FIFL. When the word line WL0 is selected and driven, the column address as the first replacement information is read out to the bit lines RFBL0, /RFBL0 to RFBL2, /RFBL2, and the second replacement information signal is read out to the bit line RIBL0. A signal of the bit line RIBL0 is read out from the NAND gate 26 of the second replacement information signal generation part 200.

Inversely, when a cell MCo in the column COL0 of the ordinary memory area of FIG. 8 is a defective cell, the column address is recorded in the memory cell of the redundant file memory RFL0–2, and data indicating that the column address is valid are recorded in the memory cell connected to a right-side bit line of the second redundant file memory FIFL. When the word line WL1 is selected, the even number word line selection signal WLe becomes the L level, and an odd number word line selection signal WLo becomes the H level, so that similarly the second replacement information signal Finf is read out.

The redundancy selection circuit RCS is configured by NAND gates 16, 18, 20, and inverters 17, 19, and when any one of the column replacement signals CI0 to CI8 is in the L level of the replacement state, the redundancy selection signal RC is set as the H level, and the readout or write from the redundancy column RCOL is permitted. When all the column replacement signals CI0 to CI8 are in the H level of the unreplaced state, the redundancy selection signal RC becomes in the L level, and a selection of the redundancy column RCOL is not carried out.

In this manner, according to this embodiment, the address of the replacing column containing the defective cell is recorded as the first replacement information signal, and the data whether or not the address is valid are recorded in the redundant file memory FIFL as the second replacement information signal. Accordingly, when the word line for the ordinary memory is selected and driven, the first and second replacement information signals are correspondingly read out from the redundant file memory, and the column replacement signals CI0 to CI8 are output based thereon, so that the defective cell is replaced with the redundant cell.

Figure 9:
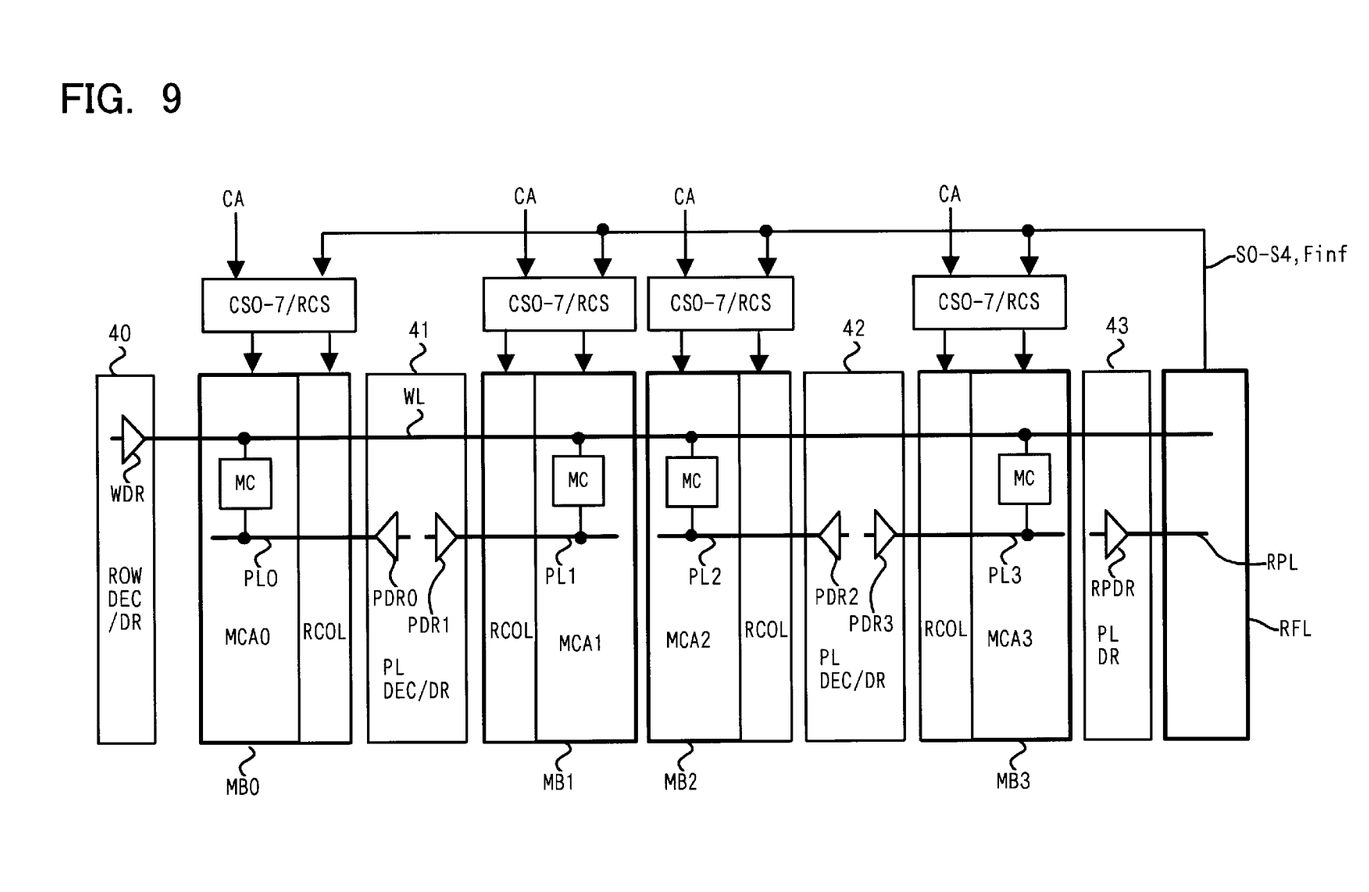
FIG. 9 is a configuration diagram of the memory device according to a modification to this embodiment.

FIG. 9 is a configuration diagram of the memory device according to a modification to this embodiment. FIG. 9 shows four memory blocks MB0–3 each of which comprises an ordinary memory area MCA0–3 and a redundant memory area RCOL, and the redundant file memory RFL provided in common in the four memory blocks. The four memory blocks MB0–3 and the word line WL in common with the redundant file memory RFL are provided, and the word line WL is driven by a word driver WDR in a common row decoder driver circuit 40. Furthermore, the four memory blocks MB0–3 are provided with each separate plate line PL0–3, and each plate line driver PDR0–3 drives a corresponding plate line PL0–3 in response to the block selection signal (not shown). Furthermore, a plate line RPL is provided also in the redundant file memory RFL, and is driven by a plate line driver RPDR in a redundancy driver circuit 43.

With the configuration of FIG. 9, the word line WL is driven in common with the four memory blocks MB0–3 and the redundant file memory RFL, but only the plate line of the selected memory block is driven. As the results, only the memory cell of the selected memory block is driven, and the data are read out.

Furthermore, as the redundant file memory RFL is provided in common with the four memory blocks, the first replacement information signal indicating the address of the replacing column containing the defective cell needs to include addresses S3, S4 of a memory block and a column address S0–2 thereof, and all of them are 5 bits. Furthermore, the second replacement information signal Finf is 1 bit. Therefore, only a defective memory cell in a certain column of a certain block is replaced with the corresponding redundancy column RCOL.

With the above configuration, as the redundant file memory RFL is provided in common with not only the plurality of columns, but also the plurality of memory blocks, it is possible to decrease a region of the redundant file memory with respect to the entire memory device.

Figure 10:
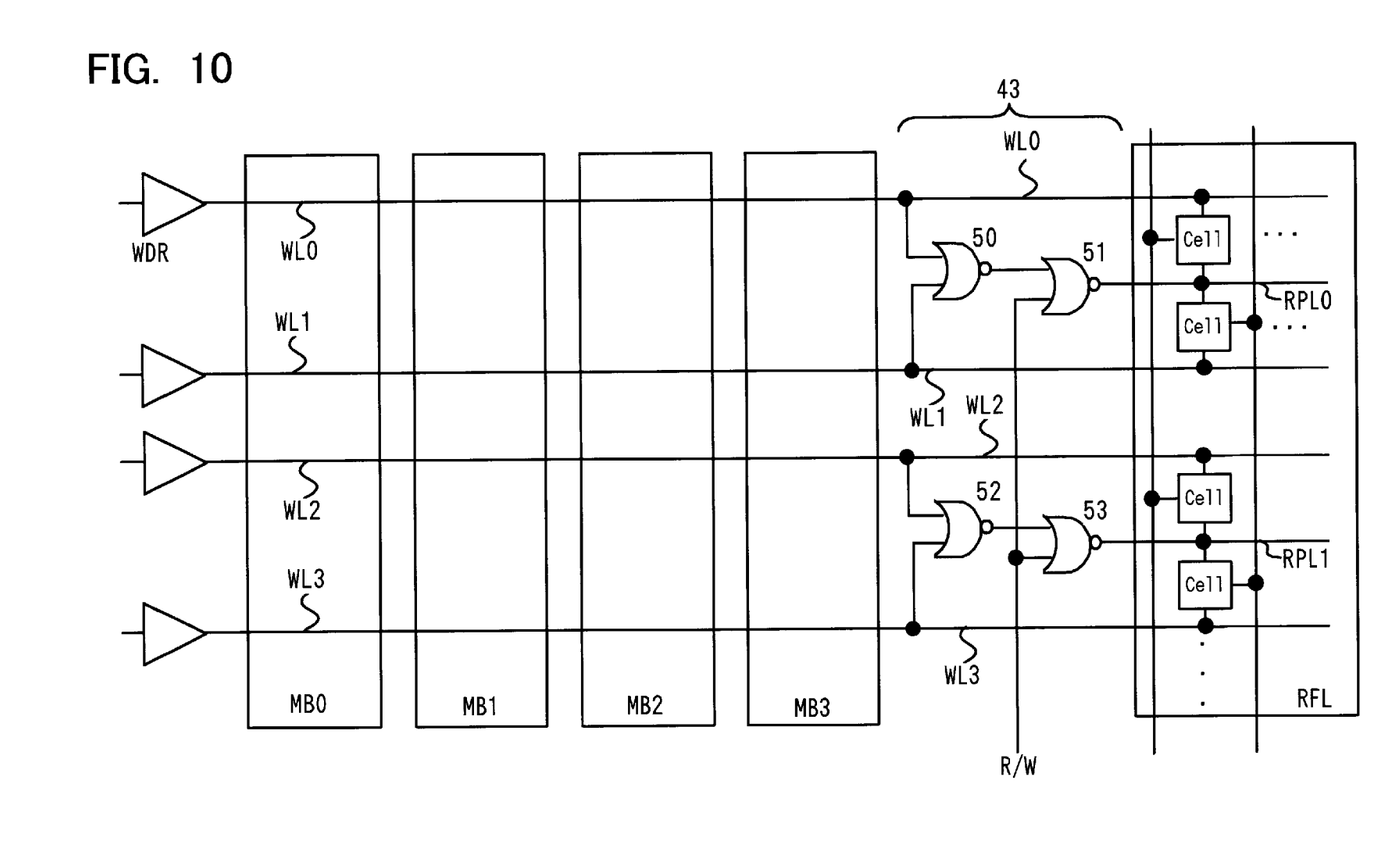
FIG. 10 is a detailed circuit diagram of a redundancy driver circuit 43 in the memory device example of FIG. 9.

FIG. 10 is a detailed circuit diagram of the redundancy driver circuit 43 in a memory device example of FIG. 9. The example of FIG. 10 is one in which one plate line RPL is provided in common in the adjacent word line. When the word line WL0–3 provided in common in the plurality of memory blocks is selected, the redundancy driver circuit 43 is demanded to drive the corresponding redundancy plate line RPL. Moreover, a different driving is needed for a readout and a write in the plate line.

As shown in FIG. 10, the redundancy driver circuit 43 is configured by a NOR gate 50 into which the word line WL0, WL1 are input, and a NOR gate 51 into which the output of the gate 50 and a read and write control signal R/W are input. The same circuit configuration is formed also with respect to the word lines WL2, WL3. With such configuration, even when any memory block is selected, the redundant file memory RFL is simultaneously selected by utilizing a signal of the common word line. At this time, the redundancy plate line RPL is driven as each waveform corresponding to the read and write control signal R/W in correspondence with the readout and write.

When reading out, the read and write control signal R/W is set to be in the L level. When the word line WL0 or WL1 is driven in the H level, a redundancy plate line RPL0 is similarly driven in the H level. Furthermore, when writing "0," the control signal R/W is set to be in the L level in the same manner as when reading out, and simultaneously when the corresponding bit line is set to be in the L level, as the redundancy plate line RPL becomes in the H level by the gate 51, the electric field is applied on the capacitor of the memory cell in a direction from the plate line to the bit line. On the other hand, when writing "1," the control signal R/W is set to be in the H level, and simultaneously when the corresponding bit line is set to be in the H level, as the redundancy plate line RPL becomes in the L level, the electric field is applied on the capacitor of the memory cell in a direction from the bit line to the plate line.

In this manner, by utilizing a signal of the word line and exploiting the read and write control signal R/W also, it is possible to appropriately drive the redundancy plate line RPL in the redundant file memory RFL.

Figure 11:
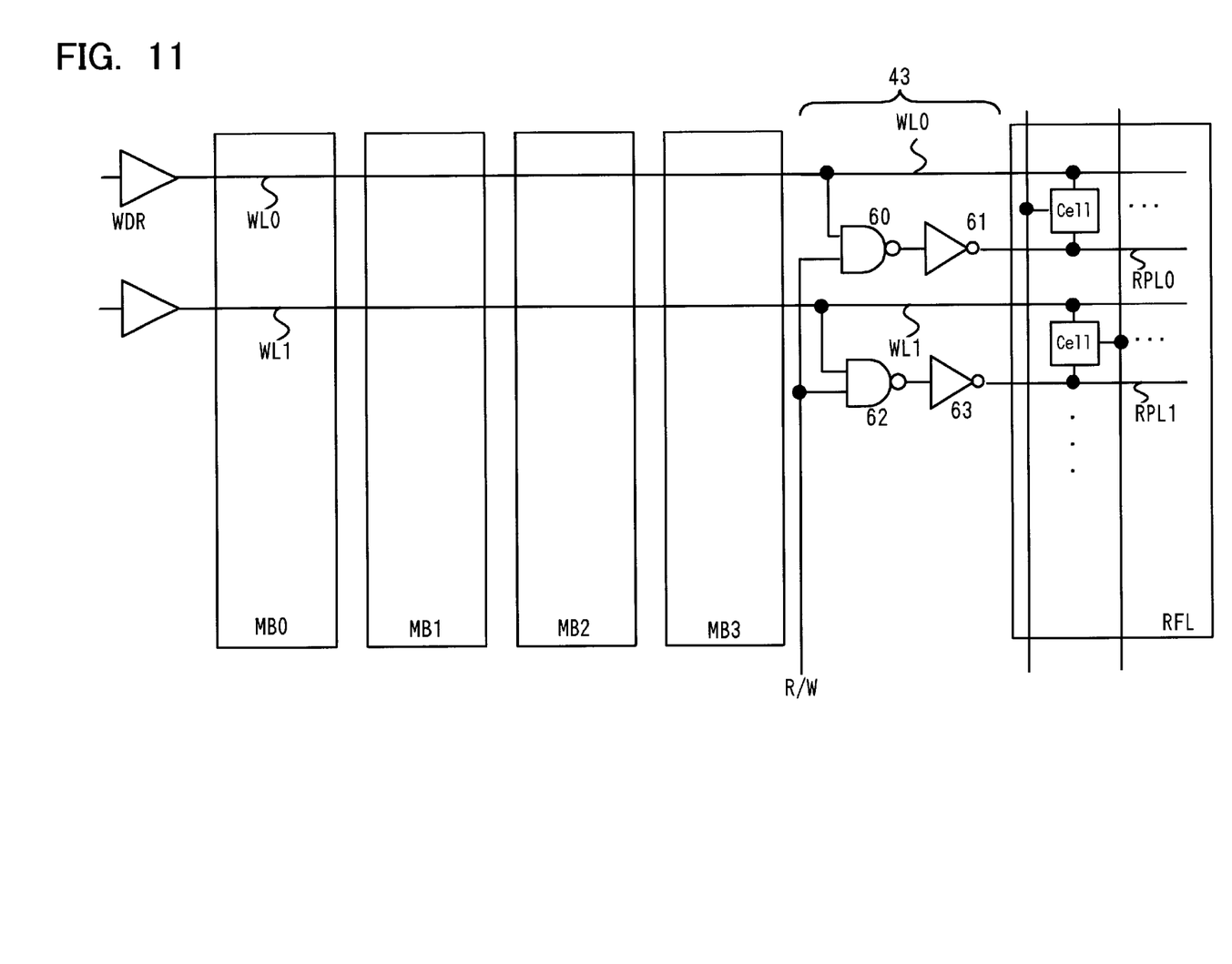
FIG. 11 is another detailed circuit diagram of the redundancy driver circuit 43 in the memory device example of FIG. 9.

FIG. 11 is an another detailed circuit diagram of the redundancy driver circuit 43 in the memory device example of FIG. 9. The example of FIG. 11 is one in which the one plate line RPL is provided to each one word line. When the word line WL0–1 provided in common in the plurality of memory blocks is selected, the redundancy driver circuit 43 drives the corresponding redundancy plate line RPL. Therefore, the redundancy driver circuit 43 is configured by a NAND gate 60 or 62 into which a signal of the word line WL0 or WL1 and the read and write control signal R/W are input, and an inverter 61 or 63.

With such configuration, when the common word line WL0 is selected to be in the H level, the redundancy plate line RPL0 in the redundant file memory RFL is also driven in correspondence with the control signal R/W. When reading out, the control signal R/W becomes in the H level. Thus, the corresponding redundancy plate line RFL0 is also driven in the same manner as in the word line WL0. Furthermore, when writing "0," the control signal R/W is set to be in the H level, and the bit line is set to be in the L level. Furthermore, when writing "1," the control signal R/W is set to be in the L level, and the bit line is set to be in the H level. Thus, the electric field in a direction of data desired to write is applied to the capacitor of the cell.

With the configurations of FIGS. 10 and 11, the redundancy plate line RPL in the redundant file memory RFL is shorter than the plate line of the other memory block, and has smaller wiring capacitance. This is because only the address of the replacing column is recorded in the redundant file memory. Accordingly, as load capacitance of the redundancy plate line is small, the driver circuit 43 can be realized with relatively small drive capability. Accordingly, by utilizing the signals of these word lines for the driver of the redundancy plate line, it is possible to form a redundancy plate line driver circuit in a small-scale circuit configuration. As the results, it is possible to minimize a region of the redundant file memory and the driver circuit with respect to the ordinary memory cell region.

Figure 12:
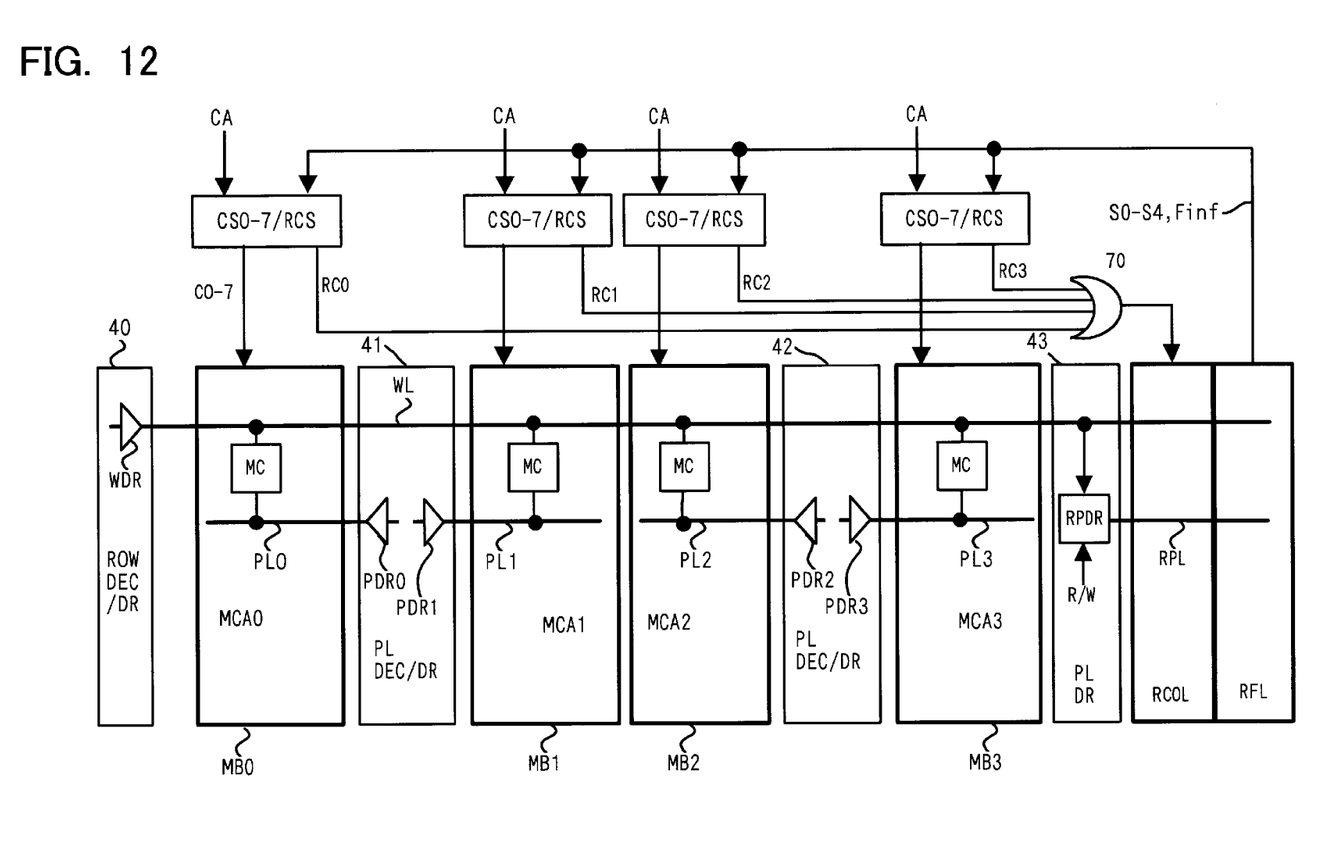
FIG. 12 is a configuration diagram of the memory device in another improved example according to this embodiment.

FIG. 12 is a configuration diagram of the memory device in another improved example according to this embodiment. In the memory device of FIG. 9, the redundant memory area RCOL is provided in each memory block MB0–3, and the redundant file memory RFL is provided in common in the four memory blocks. On the contrary, in the example of FIG. 12, in addition to the redundant file memory RFL, the redundant memory area is provided in common in the four memory blocks. The redundant memory area RCOL is replaced with the defective cell in the four memory blocks. With the configuration of FIG. 12, it is not necessary to provide the redundant memory area in each memory block, and it is possible to raise area efficiency of the entire memory device.

Furthermore, the redundant memory area RCOL and the redundant file memory RFL are provided in pair, and in the case where the two redundant memory areas are provided, the two redundant file memories RFL are also provided in conformity thereto. According to a relationship of generation probability and repair probability of the defective cell in the memory device, the number of a pair of redundant memory area and redundant memory file, which are provided in common with the plurality of memory blocks, is occasionally determined.

The example of FIG. 12 is one provided with the pair of redundant memory area RCOL and redundant memory file RFL. The same reference number in FIG. 9 is given. In the case where the word line WL is driven by the word driver WDR to perform a readout operation, in response to a drive of the word line WL, the plate lines RPL of the redundant memory area RCOL and the redundant file memory RFL which are provided in common in the plurality of memory blocks are also driven by the redundancy plate line driver RPDR. In the case, the redundancy plate line RPL is driven in accordance with the readout and write signal R/W.

The first replacement information signals S0–4 which are recorded in the redundant file memory RFL and are the addresses of the memory block and the column containing the defective cell, and the second replacement information signal Finf indicating that the recorded addresses are valid are supplied to the column selection circuit CS0–7 and the redundancy selection circuit RCS of each memory block. When a combination of the first replacement information signal S0–4 are all H level, the redundancy selection circuit RCS set one of the redundancy selection signal RC0–3 to be in the H level. Accordingly, an output of an OR gate 70 becomes in the H level, and a column gate of the redundant memory area RCOL is selected, and data in the redundant cell are output instead of data of the ordinary cell.

Even in the embodiment of FIG. 12, the block address and the column address of the defective cell can be differently recorded in the redundant memory file RFL in each word line. As the redundant memory file and the redundant memory area are provided in common in the plurality of memory blocks, the area efficiency can be increased.

According to the above embodiment, the FeRAM is described as the example, and such the redundancy configuration can also be applicable in the other nonvolatile memory, such as a memory device utilizing a floating gate. Furthermore, this is applicable to the DRAM. However, in the case of the DRAM, as record information of the redundant file memory is not nonvolatile, it is necessary to form a configuration in which it is loaded from the other nonvolatile memory when powering on, etc. Furthermore, according to the above embodiment, the description was made in the FeRAM having the memory cell configuration comprising 1 transistor and 1 capacitor, but as shown in FIG. 4, even in the FeRAM having the memory cell configuration comprising 2 transistors and 2 capacitors, this is applicable similarly.

According to the above embodiment, the redundant file memory for recording information of the replacing defective cell is configured by the same memory cell as in the ordinary memory and the redundant memory. Thus, only one type of memory cell has to be provided in the memory device, so it is possible to simplify the configuration of the memory device more than a system of utilizing the fuse ROM, etc. Moreover, as the replacement information to the redundant file memory is electrically written, even after the memory chip is housed in a package, it is possible to repair the defective cell.

Hereinabove, according to the present invention, it is possible to simplify the configuration of the memory which records the replacement information to the redundant cell. Furthermore, even after the memory chip is housed in the package, it is possible to repair the defective cell. Furthermore, it is possible to simplify the configuration of the redundant file memory.

What is claimed is:

1. A memory device allowing an ordinary cell in a defective state to be replaced with a redundant cell, comprising:

an ordinary memory area having a plurality of columns for each replacement unit;

a redundant memory area having a redundant cell of the replacement unit;

a redundant file memory, having cells of the same configuration as cells in the ordinary memory area and the redundant memory area, for recording first replacement information that contains a binary coded address of a column to be replaced among the plurality of columns in the ordinary memory area and second replacement information indicative of whether a column corresponding to the binary coded address is defective or not, the redundant file memory being accessed simultaneously with an access to the ordinary memory area to output signals of the first and second replacement information; and a selection circuit which in response to the signals of the first and second replacement information, prohibits a column selection of the ordinary memory area corresponding to the binary coded address of the first replacement information and permits a selection of the redundant memory area, when the second replacement information indicates a defective state.

2. A memory device according to claim 1, wherein the ordinary memory area, the redundant memory area, and the redundant file memory includes word lines to be driven at the same time, said redundant file memory outputting the first and second replacement information signals in response to a drive of the word line.

3. A memory device according to claim 1, further comprising a plurality of blocks each having the ordinary memory area and the redundant memory area, wherein the plurality of blocks share the redundant file memory, and the redundant file memory further records third replacement information that contains an address of a block to be replaced to the redundant memory area.

4. A memory device according to claim 1, further comprising a plurality of blocks each having the ordinary memory area, wherein the plurality of blocks share the redundant memory area and the redundant file memory, the redundant file memory records third replacement information that contains an address of a block to be replaced to the redundant memory area.

5. A memory device according to claim 3 or 4, further comprising:
   word lines shared by the ordinary memory area, the redundant memory area and the redundant file memory in the plurality of blocks, the word lines being driven at the same time;
   a plurality of plate lines provided for each block and driven correspondingly with the selected block; and
   redundant file plate lines provided in the common redundant file memory and driven together with the word lines.

6. A memory device according to claim 5, wherein the redundant file plate lines are driven together with the word lines upon reading, and the redundant file plate lines are driven in conformity with write data upon writing.

7. A memory device according to any one of claims 1 to 4, wherein
   cells within the ordinary memory area, the redundant memory area and the redundant file memory are comprised of cells that include a ferroelectric film.

8. A memory device allowing an ordinary cell in a defective state to be replaced with a redundant cell, comprising:
   an ordinary memory area having ordinary cells that include a ferroelectric film, the ordinary memory area having a plurality of columns for each replacement unit;
   a redundant memory area having a redundant cell of the replacement unit, the redundant cell using the ferroelectric film;
   a redundant file memory, having cells of the same configuration as cells in the ordinary memory area and the redundant memory area, for recording first replacement information that contains an address of a column to be replaced among the plurality of columns in the ordinary memory area and second replacement information indicative of whether a column corresponding to the address is defective or not, the redundant file memory being accessed simultaneously with an access to the ordinary memory area to output signals of the first and second replacement information; and
   a selection circuit which in response to the signals of the first and second replacement information, prohibits a column selection of the ordinary memory area corresponding to the address of the first replacement information and permits a selection of the redundant memory area, when the second replacement information indicates a defective state.

* * * * *